United States Patent

[11] 3,631,465

[72] Inventor Richard H. Heeren
Chicago, Ill.
[21] Appl. No. 822,533
[22] Filed May 7, 1969
[45] Patented Dec. 28, 1971
[73] Assignee Teletype Corporation
Skokie, Ill.

[54] FET BINARY TO ONE OUT OF N DECODER
9 Claims, 2 Drawing Figs.

[52] U.S. Cl. .......... 340/347DD, 307/205, 307/251
[51] Int. Cl. .......... H03k 13/25
[50] Field of Search .......... 340/347; 307/251, 205, 304, 279, 215, 218, 216

[56] References Cited

UNITED STATES PATENTS

| | | | |
|---|---|---|---|
| 2,769,968 | 11/1956 | Schultheis, Jr. | 340/347 X |
| 3,479,523 | 11/1969 | Pleshko | 307/251 X |
| 3,500,062 | 3/1970 | Annis | 307/218 X |
| 3,539,823 | 11/1970 | Zuk | 307/215 |
| 3,373,421 | 3/1968 | Wang | 340/347 |
| 3,355,598 | 11/1967 | Tuska | 307/251 X |

*Primary Examiner*—Maynard R. Wilbur
*Assistant Examiner*—Charles D. Miller
*Attorneys*—J. L. Landis and R. P. Miller

ABSTRACT: A circuit is described in which eight field effect transistors are interconnected to translate a two-bit binary word into one-out-of-four logic. The description further includes an explanation of how to apply the principles taught herein to build circuits for translating any "N"-bit binary coded word into one out of $2^N$ logic.

Patented Dec. 28, 1971 3,631,465

| A | B | $X_1$ | $X_2$ | $X_3$ | $X_4$ |
|---|---|---|---|---|---|
| 1 | 0 | 1 | 0 | 0 | 0 |
| 1 | 1 | 0 | 1 | 0 | 0 |
| 0 | 0 | 0 | 0 | 1 | 0 |
| 0 | 1 | 0 | 0 | 0 | 1 |

INVENTOR
RICHARD H. HEEREN
BY J. L. Landis
ATTORNEY

FET BINARY TO ONE OUT OF N DECODER

FIELD OF THE INVENTION

This invention relates to a code-translating circuit and particularly to a code-translating circuit suitable for economic fabrication by integrated circuit techniques.

BACKGROUND OF THE INVENTION

Digital circuitry has played an important role in the growth of electronic industries. As the cost of equipment for performing digital operations is reduced, digital circuits replace more and more analog circuits and find new applications previously not contemplated.

Developments enabling the fabrication of large-scale integrated logic circuit arrays have reduced the potential cost of digital equipment. Thousands of devices can be created on a semiconductor substrate which previously was employed for one device. As the size of semiconductor devices is reduced and their packing density is thereby increased, the electrical and thermal parameters which effect the design of such circuitry are altered. For example, as the size of a MOSFET is reduced, the minimum obtainable source-to-drain impedance is increased. As components are placed more closely together, stray capacity is reduced and average allowable power dissipation for each device is reduced. Further, because of the compact arrangement, bringing access leads to the circuitry increases the complexity thereof.

Existing code-translating circuits built from discrete components often employ combinations of standard logic gates. These gates, including diodes, resistors and transistors, require a bias current from a power supply. If an integrated circuit were built using these existing circuit configurations, the energy supplied from the power supply would be dissipated on the circuit chip, limiting the packing density obtainable. The logic gate approach suffers from the further disadvantage that more than the minumum number of devices is employed. Further, power supply leads would be required, increasing layout complexity.

In some approaches to the design of integrated circuits, field effect transistors are employed. The yields attainable with such circuits are often low because proper circuit operation is dependent upon a narrow range of field effect transistor parameters. Optimum circuit layout is not achieved with conventional field effect transistor circuits because different size devices are required, some of which cannot be minimum size devices.

To overcome some of the above problems, dynamic logic circuits have been developed in which field effect transistors are employed to charge and discharge distributed capacitors. These dynamic logic circuits are suitable for many circuit applications. One major drawback, however, is that the logic signals are present for only a predetermined time period, therefore requiring synchronizing clock signals. These clock signals require signal routing leads which hamper layout efficiency. Redundant devices for performing some logical functions are still required in various positions of the layout and waste silicon real estate.

BRIEF DESCRIPTION OF THE INVENTION

To overcome these problems the present invention has been developed in which an "N"-bit binary coded word is decoded to provide a one out of $2^N$ logic signal. The first and second bits of the binary word are passed through circuits which provide the first and second bits and their complements, respectively. One of a pair of controlled terminals of two field effect transistors are driven by the first data bits while one of a pair of controlled terminals of two additional field effect transistors are driven by the complement of the first data bit. The gates of one of the first field effect transistors and one of the additional field effect transistors are driven by the second data bit while the gates of the remaining two field effect transistors are driven by the complement of the second data bit, thereby decoding the first two binary data bits by providing a one-out-of-four logic signal at the second controlled terminals of the four field effect transistors.

In one embodiment, four additional field effect transistors are employed, each having a second one of its controlled terminals connected to the second controlled terminal of a different one of the first four field effect transistors to ensure a low impedance output signal for all states of the binary coded word. The first controlled terminals of the four additional field effect transistors are connected to the respective gates of the associated first four field effect transistors. The gages of the additional four field effect transistors are driven by the second bit if their associated field effect transistor is driven by the complement of the second bit. The gates of the remaining additional field effect transistors are driven by the complement of the second bit.

DETAILED DESCRIPTION OF THE INVENTION

Figures 1, 2:
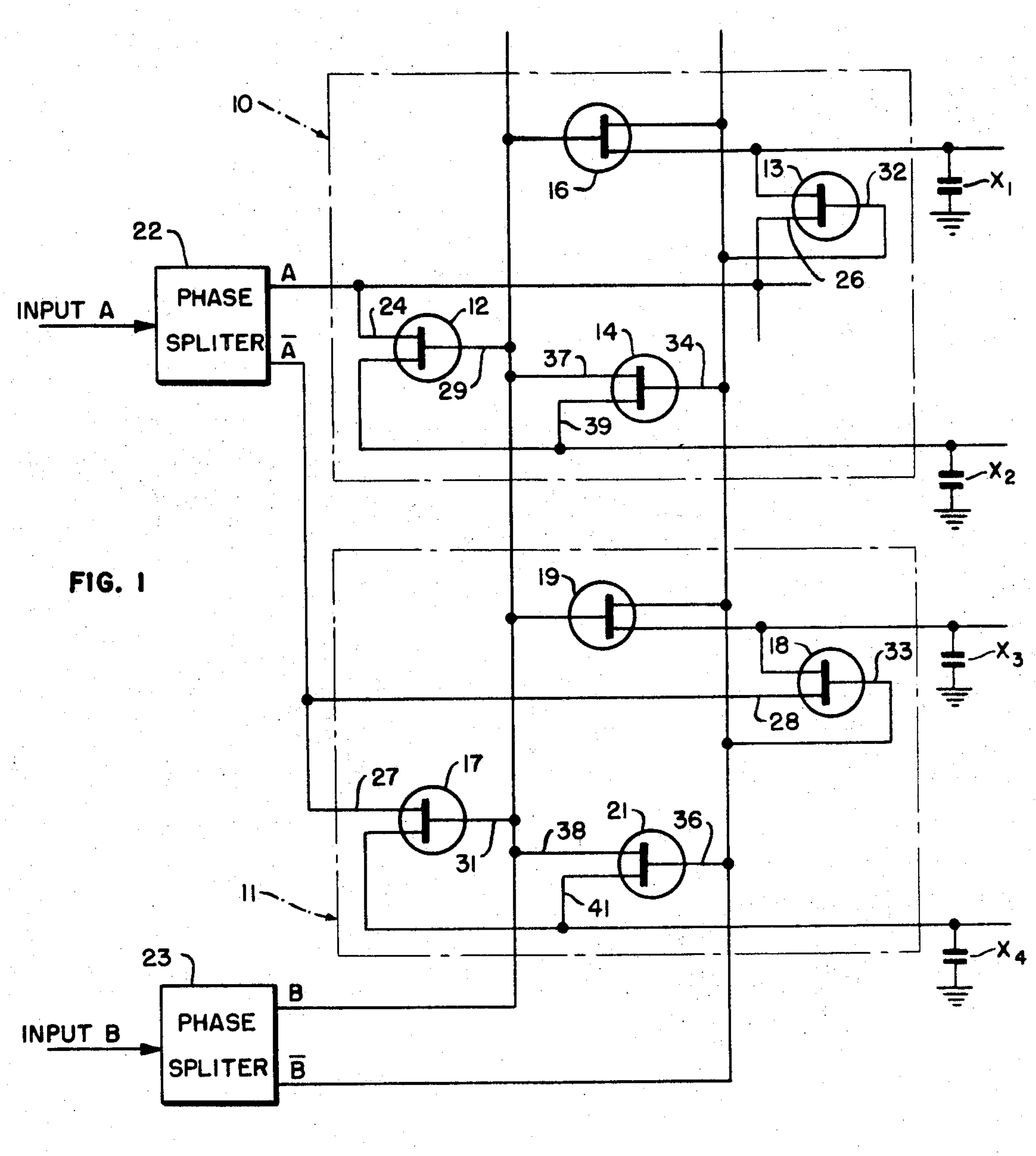
FIG. 1 is a schematic diagram showing a circuit embodying the principles of this invention.
FIG. 2 is a truth table describing the logic performed by the circuit of FIG. 1.

When processing information with electronic circuits, it is often necessary to transform data available in one code format to data in another code format before performing specific functions. Most digital data is handled and processed as binary coded words. This format is convenient since a maximum of information can be expressed with a minimum of bits. An N-bit binary word, for example, contains $2^N$ information indicative combinations.

To retrieve information stored in a memory, however, it is more convenient to use a different code format. Typically, information is stored in a memory at locations arranged in a matrix array. The number of leads required to access the memory is related to the number of memory locations. Normally, two unique access leads are energized for each memory location. When a binary coded word is provided to indicate which access leads of a matrix are to be energized, a code format translation circuit is required.

A circuit shown in FIG. 1, illustrative of the principles of this invention, converts a two-bit binary coded data word into a "one-out-of-four" logic signal. The two data bits are applied to input terminals A and B respectively. The "one-out-of-four" output signal appears across output capacitors $X_1$ through $X_4$ respectively, in accordance with the truth table in FIG. 2.

The circuit shown in FIG. 1 contains two identical circuits 10 and 11, each enclosed in dashed lines, which serve as the basic building block for circuits built in accordance with this invention. Each circuit, such as circuit 10, includes four enhancement mode, P-channel MOS field effect transistors such as field effect transistors 12, 13, 14, and 16. The field effect transistors 12 and 13 serve as logic devices while the field effect transistors 14 and 16 serve as ground return devices. The circuit 11 includes logic device field effect transistors 17 and 18 and ground return field effect transistors 19 and 21. Each field effect transistor employed herein is characterized in that a negative voltage applied to its gate will induce a low impedance between a pair of controlled terminals conventionally termed "ON," while a ground potential applied to its gate will induce a high impedance between the pair of controlled terminals. The term controlled terminals is used herein to describe the source and drain electrodes because the terms source and drain refer to directions of current flow in the field effect transistor. Since, as will become apparent, the current flowing in the field effect transistors of this invention changes direction during circuit operation, the terms source and drain have no relevancy.

The input terminals A and B are connected to the circuits 10 and 11 by phase splitters 22 and 23, such as are disclosed in my copending application, Ser. No. 822,520, filed on even date herewith. Each phase splitter 22 and 23 has a single input terminal, input terminals A and B respectively, and a pair of output terminals A and $\overline{A}$, and B and $\overline{B}$ respectively. A signal will appear on output terminal A which is identical to the signal applied to input terminal A while the complement of the signal applied to input terminal A will appear on output terminal $\overline{A}$. In a like manner the signal applied to input terminal B will appear on output terminal B while the complement thereof will appear on output terminal $\overline{B}$. It should be apparent that a simple inverter circuit would serve the same function as the phase splitter 22 or 23. When an inverter is employed the input terminals A and B would also serve as output terminals A and B respectively.

The output terminals of phase splitter 22, A and $\overline{A}$, are connected to first controlled terminals 24 and 26 (for A) and 27 and 28 (for $\overline{A}$) of logic field effect transistors 12 and 13, and 17 and 18, respectively. The output terminals of phase splitter 23, B and $\overline{B}$, are connected to the gates 29 and 31 (for B) and 32 and 33 (for $\overline{B}$) of the logic field effect transistors 12 and 17, and 13 and 18, respectively.

In operation a two-bit data signal in which a "1" is represented by a −V potential and "0" is represented by a ground potential is applied to input terminals A and B. When the two-bit data word is "1" "0" as shown in the first row of the truth table in FIG. 2, a −V potential appears on output terminal A of the phase splitter 22 while a ground potential appears on the $\overline{A}$ output terminal of phase splitter 22. In a like manner a ground potential appears upon output terminal B and a −V potential appears on output terminal $\overline{B}$ of the phase splitter 23. The −V potential on the output terminal $\overline{B}$ turns ON the logic field effect transistors 18 and 13 while the ground potential on output terminal B maintains the field effect transistors 17 and 12 in an OFF condition. The −V potential on the output terminal A is passed by the ON field effect transistor 13 to the output capacitor $X_1$.

The other three output capacitors $X_2$–$X_4$ do not respond in this example (1, 0). Specifically, (1) the OFF field effect transistor 12 blocks the −V potential on the output terminal A from the output capacitor $X_2$; (2) the ON field effect transistor 18 passes the ground potential on output $\overline{A}$ to the output capacitor $X_3$; and (3) the OFF field effect transistor 17 inhibits the ground signal on the output terminal $\overline{A}$ from reaching output capacitor $X_4$.

Therefore, it is seen that, with the field effect transistors 12, 13, 17 and 18 driven by an input signal of "1" "0," a −V potential indicating a "1" appears across the output capacitor $X_1$ while a ground potential is impressed across output capacitor $X_3$. A −V potential is not impressed across the output capacitors $X_2$ and $X_4$. Therefore, if one were to sense the output capacitors $X_1$ through $X_4$ looking for a −V potential, one would find the −V potential only across the output capacitor $X_1$ provided that capacitors $X_2$ and $X_4$ were previously at ground or not storing charge.

It is more convenient in sensing the output conditions o the capacitors $X_1$ through $X_4$, however, to have a potential applied through a relatively low impedance source to each of the output capacitors $X_1$ through $X_4$. For this purpose, the ground return, field effect transistors 14 and 21 have their gates 34 and 36 connected to the $\overline{B}$ output terminal of phase splitter 23. First controlled terminals 37 and 38 of the field effect transistors 14 and 21 are connected to the B output terminals of phase splitter 23. The second controlled terminals 39 and 41 of the field effect transistors 14 and 21 are connected to the output capacitors $X_2$ and $X_4$ respectively. In this way, each time the output B exhibits a ground potential, ground return field effect transistors 14 and 21 are turned ON by the −V potential on output $\overline{B}$. The ground potential on output B is therefore passed to output capacitors $X_2$ and $X_4$.

If the signals on input terminals A and B switch from their present condition of "1" "0" to "1" "1" as shown in the second row of the truth table in FIG. 1, the field effect transistors 13 and 18 are turned OFF y the ground potential now appearing on output terminal $\overline{B}$ of phase splitter 23 while logic transistors 12 and 17 are turned ON by the −V potential appearing on output terminal B. The logic field effect transistor 12 applies the −V potential still appearing on output terminal A of phase splitter 22 to output capacitor $X_2$. It should be noted at this point that the first controlled terminal of logic field effect transistor 12 while the capacitor $X_2$ is charging. Logic field effect transistor 17 applies the ground potential still on output terminal $\overline{A}$ of phase splitter 22 to output capacitor $X_4$. It should be noted that since output capacitor $X_4$ had a ground potential thereacross, no current flows through logic field effect transistor 17.

The ground return field effect transistors 14 and 21 are now OFF due to the ground potential on output terminal $\overline{B}$ of phase splitter 23. The ground return field effect transistors 16 and 19 on he other hand are now in the ON condition due to the −V potential on output terminal B of phase splitter 23. The ground return field effect transistor 19 merely maintains the potential across capacitor $X_3$ in its previous ground condition as did logic transistor 17 maintain output capacitor $X_4$ in its prior condition. Ground return transistor 16 on the other hand, now in its ON condition, discharges capacitor $X_1$ to the ground supplied on output terminal $\overline{B}$ of the phase splitter. It can be seen, therefore, that the output potentials on capacitors $X_1$ through $X_4$ are arranged in accordance with the truth table in FIG. 2.

It should be noted, see FIG. 2, that the A output applied to the circuit 10 was a "1" or −V potential in both of the examples noted above. When the B output switched from "0" to "1,"the −V signal of the A output switched from the capacitor $X_1$ to the capacitor $X_2$. It should be further noted that the $\overline{A}$ output applied to the circuit 11 was "0" or ground potential in both of the examples cited above. Upon examination of the first two rows of the truth table in FIG. 2, columns $X_3$ and $X_4$, it is seen that the outputs $X_3$ and $X_4$ were "0" without regard to the condition of the signal at the B output. Therefore, it can be seen that each of the identical circuits 10 and 11 serve as digital steering devices for the "1" output.

It can be appreciated also that additional circuits similar to 10 and 11 may be combined to convert N-bit binary coded words, when N is greater than 2, into one-out-of-$2^N$ logic. For example, a one-out-of-eight logic circuit, driven by three binary bits, can be constructed by adding four more circuits such as circuits 10 and 11. Each one of the added circuits would have its input (in circuits 10 and 11 the inputs are those leads connected to outputs A or $\overline{A}$ of phase splitter 22) connected to a different output lead of circuits 10 and 11 (output leads are those connected to the output capacitors $X_1$ through $X_4$). The third binary bit and its complement bit would be employed to drive the gates of all the transistors in the four additional circuits in the same way that outputs B and $\overline{B}$ of phase splitter 23 drive all the gates of the circuits 10 and 11. Thus, the circuits 10 and 11 would sum the 4 combinations of A and B, as intermediate stages, feeding 8 output FETs to provide one output for each distinctive combination of the three input bits.

In general, to convert an N-bit word, $2^N$ output FETs are provided similar to FETs 12, 13, 17 and 18, as well as as many intermediate stages as are necessary in various possible arrays, such that each output FET turns ON for only one of the $2^N$ possible combinations of the coded words.

One further point of circuit operation not brought out in the prior discussion is noted when the signals on input terminals A and B switch from their prior condition of "1" "1" to the condition "0" "1." In this case, since the B and $\overline{B}$ inputs remain at the same values, all the transistors previously ON remain ON and all the transistors previously OFF remain OFF. The negative voltage previously on transistor $X_2$ is discharged through logic field effect transistor 12 to ground potential now appearing on output A of phase splitter 22. The first controlled terminal 24 is now positive with respect to the second controlled terminal during the discharging procedure. Therefore it is seen that, while the first controlled terminal 24 served as a drain in the prior example, it serves as a source in this example.

The output capacitor $X_4$ is charged to −V potential from output $\bar{A}$ of phase splitter 22 through logic field effect transistor 17. The ground potential previously on output capacitors $X_1$ and $X_3$ remains unchanged. Therefore, from looking at the truth table in FIG. 2, one can see that the outputs $X_1$ through $X_4$ again conform thereto.

Although the invention has been described with reference to a particular embodiment, it is to be understood that this embodiment is only illustrative of the application of the principles of the invention, and that numerous modifications may be made wherein and other arrangements may be devised without departing from the spirit and scope of the invention. While the code-translating circuits may be used in the performance of various logic functions, one particular circuit in which they may advantageously be used is described in a related copending application of applicant and C. R. Winston entitled "Read-Only Memory Arrays in which a Portion of the Memory Addressing Circuitry is Integral to the Array," Ser. NO. 822,521, filed on even date herewith.

What is claimed is:

1. In combination, a. means for providing a first binary information signal on a first input lead;

b. means responsive to a second binary information signal for providing said second binary information signal on a second input lead and an inversion of said second binary information signal on a third input lead, the binary information signals each being capable of assuming either of two different voltage levels depending on the state of a bit of binary information being represented;

c. a first field effect transistor having a gate and first and second controlled terminals;

d. means for electrically connecting said first field effect transistor to said first and third input leads, said first controlled terminal being electrically connected directly to said first lead only and said gate being electrically connected directly to said third lead;

e. an output conductor electrically connected directly to said second controlled terminal;

f. a second field effect transistor having a gate, and first and second controlled terminals;

g. means for electrically connecting said second field effect transistor to said second and third input leads, said first controlled terminal being electrically connected directly to said third lead and said gate being electrically connected directly to said second lead only; and h. means for electrically connecting said second controlled terminal of said first field effect transistor directly to said second controlled terminal of said second field effect transistor and to said output conductor.

2. The combination as defined in claim 1, also including:

i. a third field effect transistor having a gate, and first and second controlled terminals;

j. means for electrically connecting said third field effect transistor to said first and second input leads, said first controlled terminal being electrically connected directly to said first lead only and said gate being electrically connected directly to said second lead only;

k. a second output conductor electrically connected directly to the second controlled terminal of said third field effect transistor;

l. a fourth field effect transistor having a gate, and first and second controlled terminals;

m. means for electrically connecting said fourth field effect transistor to said second and third input leads, said first controlled terminal being electrically connected directly to said second lead only and said gate being electrically connected directly to said third lead only; and n. means for electrically connecting said second controlled terminal of said third field effect transistor directly to said second controlled terminal of said fourth field effect transistor and to said second output conductor.

3. The combination as defined in claim 2 also including: first and second output capacitors connected between said first and second output conductors, respectively, and a low impedance point.

4. In combination, a. means responsive to a first binary information signal for providing said first binary information signal on a first input lead and an inversion of said first binary information signal on a second input lead so as to provide first complementary binary information signals on the first and second leads;

b. means responsive to a second binary information signal for providing said second binary information signal on a third input lead and an inversion of said second binary information signal on a fourth input lead so as to provide second complementary binary information signals on the third and fourth leads;

c. four pairs of field effect transistors, each field effect transistor having a gate and first and second controlled terminals;

d. conductor means for electrically connecting a selected one of the four input leads directly to the gate of a first transistor from each pair, and for electrically connecting a selected one of the two leads associated with the other binary information signal directly to the first controlled terminal of each first transistor, the conductor means being arranged so that the four first transistors are connected in a pattern wherein each first transistor has its gate and its first controlled terminal connected to a different combination of two of the input leads (other than the leads corresponding to each binary information signal and its inversion);

e. conductor means for electrically connecting said second controlled terminal of each of said fist field effect transistors in each of said pairs to said second controlled terminal of the second field effect transistor in aid respective pair providing four output ports;

f. conductor means for selectively electrically connecting said first controlled terminal of said second field effect transistor of each pair in a pattern such that the first controlled terminal of each second transistor is electrically connected directly to the same input lead as the gate of the corresponding first transistor of that pair; and g. conductor means for electrically connecting the gate of each second transistor of each pair directly to the input lead corresponding to the complement of the binary information signal associated with the input connected to the first controlled terminal of that second transistor.

5. The combination as defined in claim 4 also including: four capacitors, each being electrically connected directly to a different corresponding one of said four output ports.

6. In combination, a. first, second, third, and fourth field effect transistors, each field effect transistor having a gate and first and second controlled terminals;

b. means for electrically connecting said first controlled terminal of said first and second field effect transistors directly to each other to form a first input port;

c. means for electrically connecting said second controlled terminal of said first and third field effect transistors directly to each other to form a first output port;

d. means for electrically connecting said second controlled terminal of said second and fourth field effect transistors directly to each other to form a second output port;

e. means for electrically connecting said gates of said first and fourth field effect transistors and said first controlled terminal of said third field effect transistor directly to each other to form a second input port; and f. means for electrically connecting said gates of said second and third field effect transistors and said first controlled terminal of said fourth field effect transistor directly to each other to form a third input port.

7. A binary decoding circuit comprising first and second circuits as recited in claim 6, for converting two-bit binary coded data signals A B into one-out-of-four logic signals, each bit A and B being such that one state is a voltage capable of turning any of the FETs ON and the other state is ground, the decoding circuit further comprising:

g. first and second phase splitting circuits, each having an input and two outputs, for generating the first bit A and its complement $\bar{A}$ and the second bit B and its complement $\bar{B}$;

h. means for electrically connecting the phase-splitter output A to the first input port of the first claim 8 circuit, and for electrically connecting the output $\bar{A}$ to the first input port of the second claim 8 circuit; and i. means for electrically connecting the phase-splitter output B to the second input port of both claim 8 circuits, and for electrically connecting the output $\bar{B}$ to the third input port of both claim 8 circuits, whereby a voltage from A at the first output port of the first claim 8 circuit indicates the combination AB, a voltage from A at the second output port of the first claim circuit indicates $A\bar{B}$, a voltage from $\bar{A}$ at the first output port of the second claim 8 circuit indicates $\bar{A}B$, and a voltage at the second output port of the second claim 8 circuit indicates $\bar{A}\bar{B}$, and whereby all but the selected output port are connected to the ground of an associated one of the data bits and complements through associated ones of the transistors.

8. A decoding circuit as recited in claim 7, wherein:

each output port is electrically connected to an output capacitor, corresponding one to each possible combination of the data signals, the capacitor selected for each combination being charged from the associated data input A or $\bar{A}$ through one of the first transistors, the other three capacitors being connected to ground of other data inputs through selected ones of the first, second, third and fourth transistors.

9. A logic circuit, comprising:

a. an input conductor;

b. a first gating device having an enabling gate electrode that permits the device to conduct current from a first terminal to a second terminal of the device, said gate electrode being electrically connected to be enabled by a predetermined gate voltage on a first conductor to connect said input conductor with a first output terminal;

c. a first output capacitor electrically connected to the first output terminal;

d. a second gating device having its gate electrode connected to be enabled by said predetermined gate voltage on a second conductor to connect said input conductor with a second output terminal;

e. a second output capacitor electrically connected to the second output terminal;

f. a third gating device having its gate electrode connected to be enabled by said predetermined gate voltage on the second conductor to complete a discharge path from the first output capacitor to ground; and g. a fourth gating device having its gate electrode connected to be enabled by said predetermined gate voltage on the first conductor to complete a discharge path from the second output capacitor to ground;

h. the first and second conductors being energizable alternatively to said redetermined gate voltage, so that only one of the output capacitors will receive current from the input conductor to charge that capacitor depending on which of the first and second conductors is energized and so that the other output capacitor is discharged to ground if previously charged.

* * * * *